(12) United States Patent
Patil et al.

(10) Patent No.: US 11,581,262 B2
(45) Date of Patent: Feb. 14, 2023

(54) PACKAGE COMPRISING A DIE AND DIE SIDE REDISTRIBUTION LAYERS (RDL)

(71) Applicant: QUALCOMM Incorporated, San Diego, CA (US)

(72) Inventors: Aniket Patil, San Diego, CA (US); Brigham Navaja, San Diego, CA (US); Hong Bok We, San Diego, CA (US); Yuzhe Zhang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 269 days.

(21) Appl. No.: 16/590,718

(22) Filed: Oct. 2, 2019

(65) Prior Publication Data

US 2021/0104467 A1     Apr. 8, 2021

(51) Int. Cl.
*H01L 23/538*  (2006.01)
*H01L 23/31*  (2006.01)
*H01L 23/495*  (2006.01)

(52) U.S. Cl.
CPC ...... *H01L 23/5389* (2013.01); *H01L 23/3114* (2013.01); *H01L 23/4951* (2013.01); *H01L 23/5386* (2013.01); *H01L 2224/02371* (2013.01)

(58) Field of Classification Search
CPC ............................................. H01L 2224/02371
See application file for complete search history.

(56) References Cited

U.S. PATENT DOCUMENTS

| 2016/0141238 | A1 | 5/2016 | Yoon et al. |
| 2016/0155730 | A1* | 6/2016 | Yu ..................... H01L 21/76895 257/774 |
| 2018/0269186 | A1 | 9/2018 | Kang et al. |
| 2019/0139876 | A1* | 5/2019 | Lee ..................... H01L 21/4857 |
| 2019/0261513 | A1 | 8/2019 | Hizume |
| 2021/0272913 | A1* | 9/2021 | Kim ..................... H01L 21/4853 |

OTHER PUBLICATIONS

International Search Report and Written Opinion—PCT/US2020/048869—ISA/EPO—dated Nov. 9, 2020.

* cited by examiner

*Primary Examiner* — Moazzam Hossain
*Assistant Examiner* — Hajar Kolahdouzan
(74) *Attorney, Agent, or Firm* — Michelle Gallardo

(57) ABSTRACT

A package that includes a second redistribution portion, a die coupled to the second redistribution portion, an encapsulation layer encapsulating the die, and a first redistribution portion coupled to the second redistribution portion. The first redistribution portion is located laterally to the die. The first redistribution portion is located over the second redistribution portion. The first redistribution portion and the second redistribution portion are configured to provide one or more electrical paths for the die.

30 Claims, 16 Drawing Sheets

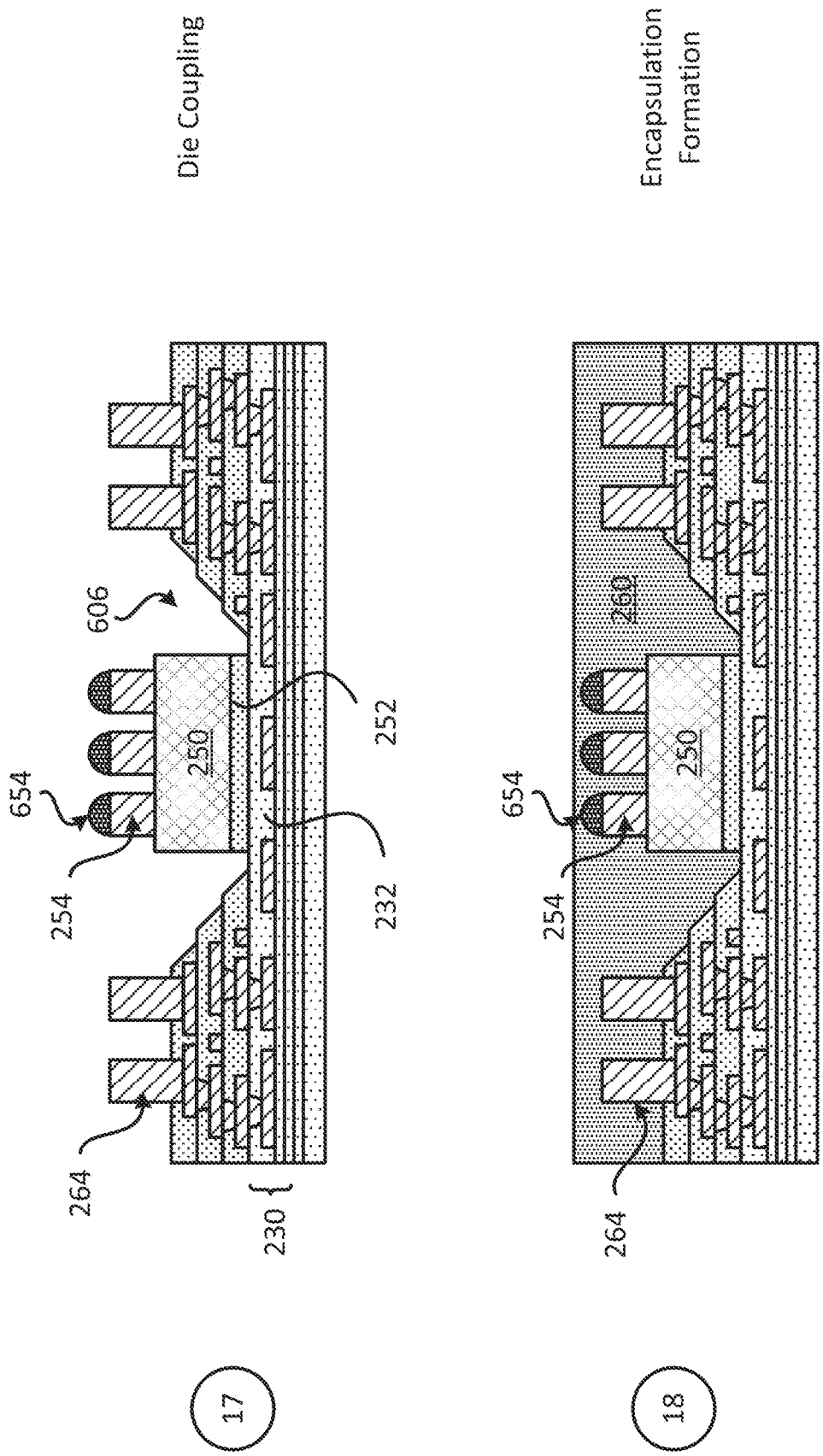

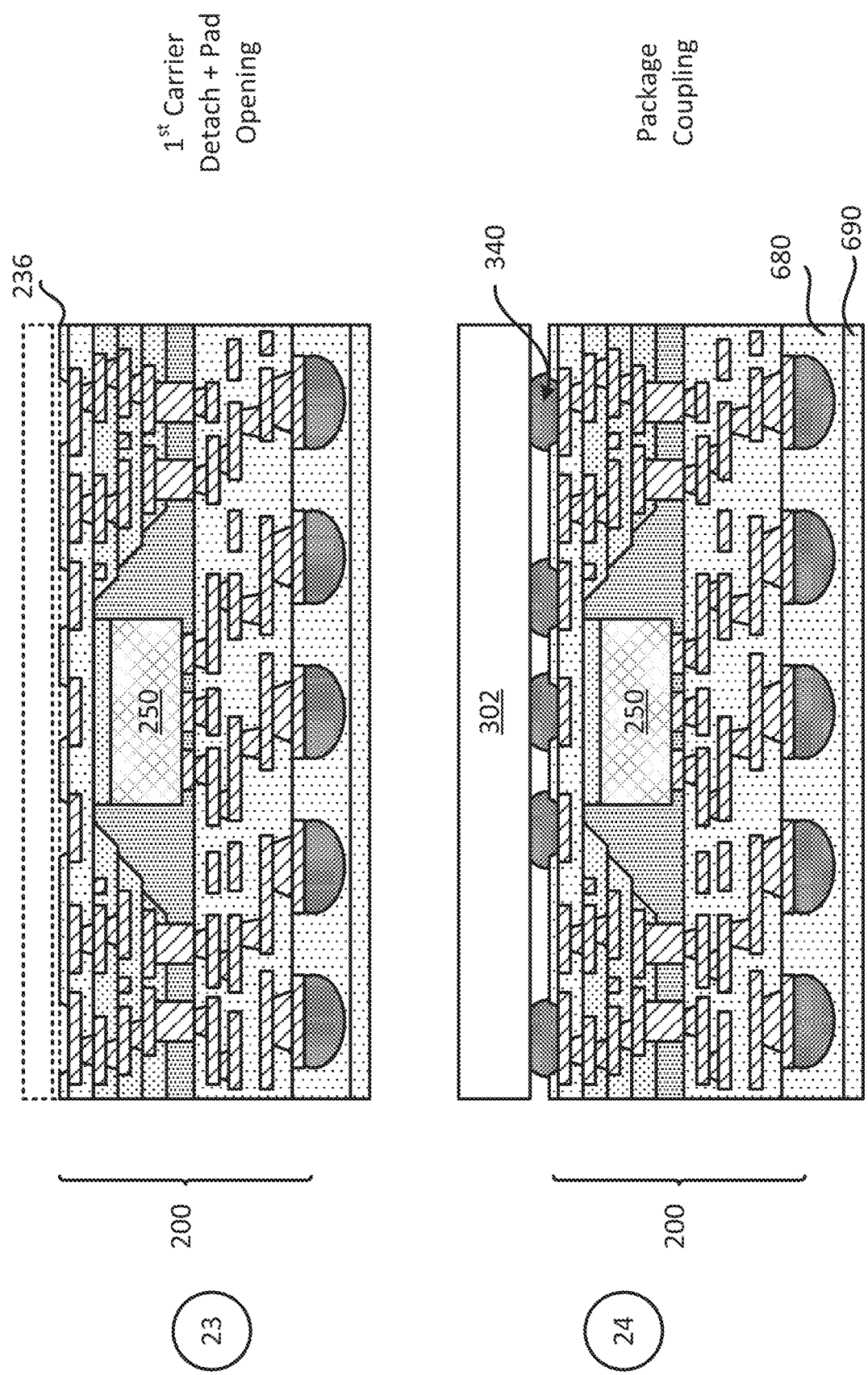

PACKAGE COMPRISING A DIE AND DIE SIDE REDISTRIBUTION LAYERS (RDL)

FIELD

Various features relate to integrated devices packages that includes a die, but more specifically to integrated devices packages that includes a die and die side redistribution layer(s).

BACKGROUND

FIG. 1 illustrates a package 100 that includes a package 101 and an die 180. The die 180 is located over the package 101. The package 101 includes a substrate 102 and a die 104. The die 104 is coupled to a first surface of the substrate 102 through a plurality of solder interconnects 140, which may include bumps and pillars.

The substrate 102 includes a plurality of dielectric layers 120, a plurality of interconnects 122, and a plurality of surface interconnects 123. Each layer of the dielectric layers 120 includes a patterned metal layer and vias. The substrate 102 includes a first solder resist layer 124, a second solder resist layer 126, and a plurality of solder interconnects 130. A plurality of solder interconnects 170 are coupled to the substrate 102 and the die 180. An encapsulation layer 160 encapsulates the die 104 and the plurality of solder interconnects. The die 104 may be configured to be electrically coupled to the die 180 through the plurality of solder interconnects 140, the plurality of surface interconnects 123, the plurality of interconnects 122 and the plurality of solder interconnects 170. There is an ongoing need to provide smaller devices.

SUMMARY

Various features relate to integrated devices packages that includes a die, but more specifically to integrated devices packages that includes a die and die side redistribution layer(s).

One example provides a package that includes a second redistribution portion, a die coupled to the second redistribution portion, an encapsulation layer encapsulating the die, and a first redistribution portion coupled to the second redistribution portion. The first redistribution portion is located laterally to the die. The first redistribution portion is located over the second redistribution portion. The first redistribution portion and the second redistribution portion are configured to provide one or more electrical paths for the die.

Another example provides a package that includes (i) a first integrated device package and (ii) an integrated device coupled to the first integrated device package. The first integrated device package includes a second redistribution portion, a die coupled to the second redistribution portion, an encapsulation layer encapsulating the die, and a first redistribution portion coupled to the second redistribution portion, and a third redistribution portion located over the first redistribution portion and the encapsulation layer. The first redistribution portion is located laterally to the die. The first redistribution portion is located over the second redistribution portion. The first redistribution portion, the second redistribution portion, and the third redistribution portion are configured to provide one or more electrical paths for the die.

Another example provides an apparatus that includes second means for redistribution, a die coupled to the second means for redistribution, means for encapsulation configured to encapsulate the die, and first means for redistribution coupled to the second means for redistribution. The first means for redistribution is located laterally to the die. The first means for redistribution is located over the second means for redistribution. The first means for redistribution and the second means for redistribution are configured to provide one or more electrical paths for the die.

Another example provides a method for fabricating a package. The method forms a back side redistribution portion. The method forms a die side redistribution portion over the back side redistribution portion. The method couples a die to the back side redistribution portion, such that the die is located laterally to the die side redistribution portion. The method forms an encapsulation layer over the die. The method forms a front side redistribution portion over the die side redistribution portion.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes (i) a front side redistribution portion (e.g., second redistribution portion), (ii) a die coupled to the front side redistribution portion, (iii) an encapsulation layer encapsulating the die, and (iv) a die side redistribution portion (e.g., first redistribution portion) coupled to the front side redistribution portion. The die side redistribution portion is located laterally to the die. The die side redistribution portion is located over the front side redistribution portion. The die side redistribution portion and the front side redistribution portion are configured to provide one or more electrical paths for the die. In some implementations, the package includes a back side redistribution portion (e.g., third redistribution portion), where the die side redistribution portion, the front side redistribution portion and the back side redistribution portion are configured to provide one or more electrical paths for the die. Another package and/or another die may be coupled to the back side redistribution portion of the package.

The die side redistribution portion provides several advantages. One, the die side redistribution portion may allow for more interconnects in the package without increasing the overall thickness or size of the package. Two, the die side redistribution portion may reduce the need to do any further redistribution of interconnects in the back side redistribution portion and/or the front side redistribution portion. Other advantages of the die side redistribution portion are further described below.

Exemplary Package Comprising a Die and a Die Side Redistribution Layers (RDL)

Figure 1:
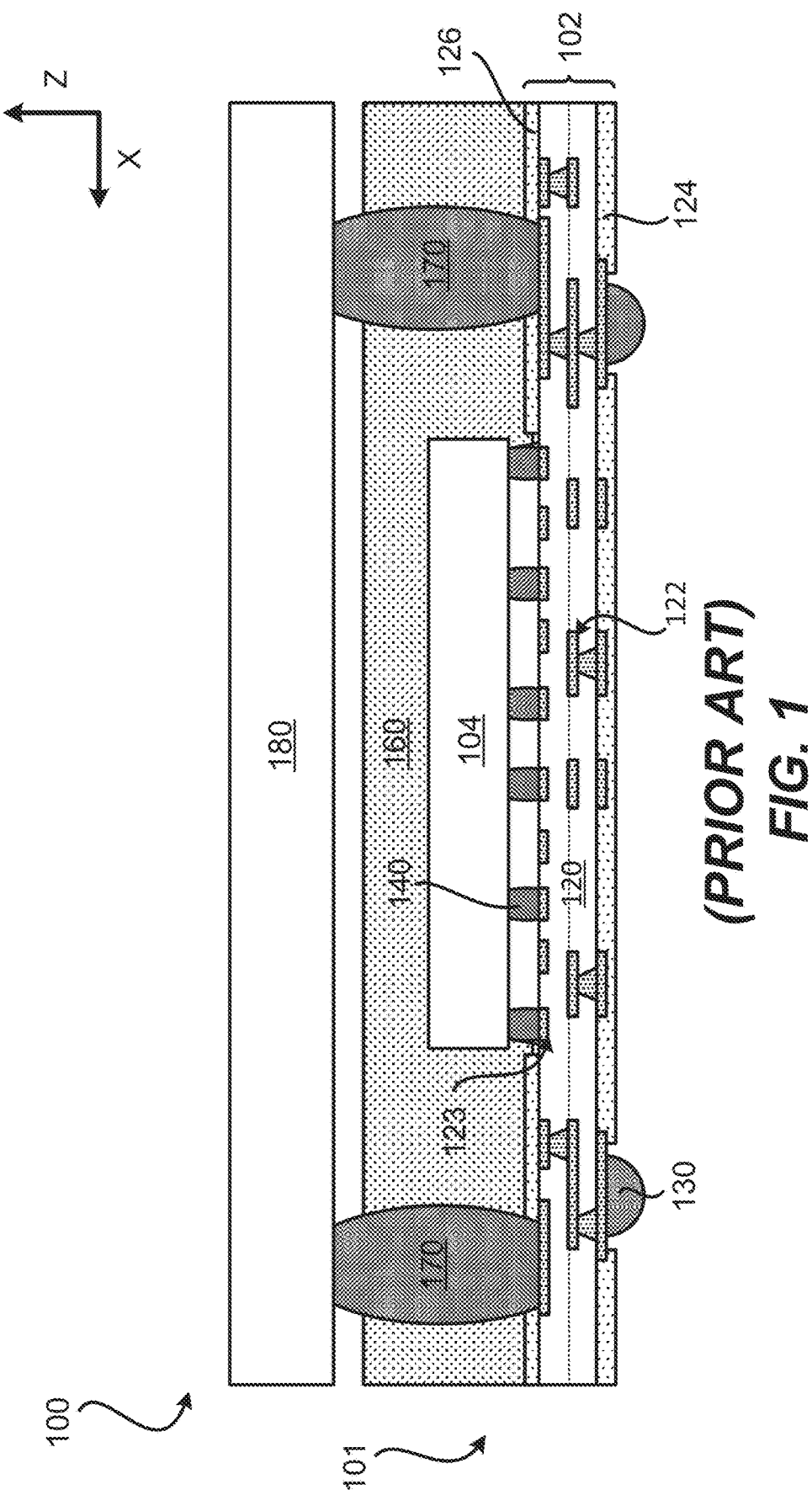
FIG. 1 illustrates a profile view of a device that includes a die and a substrate.
Figure 2:
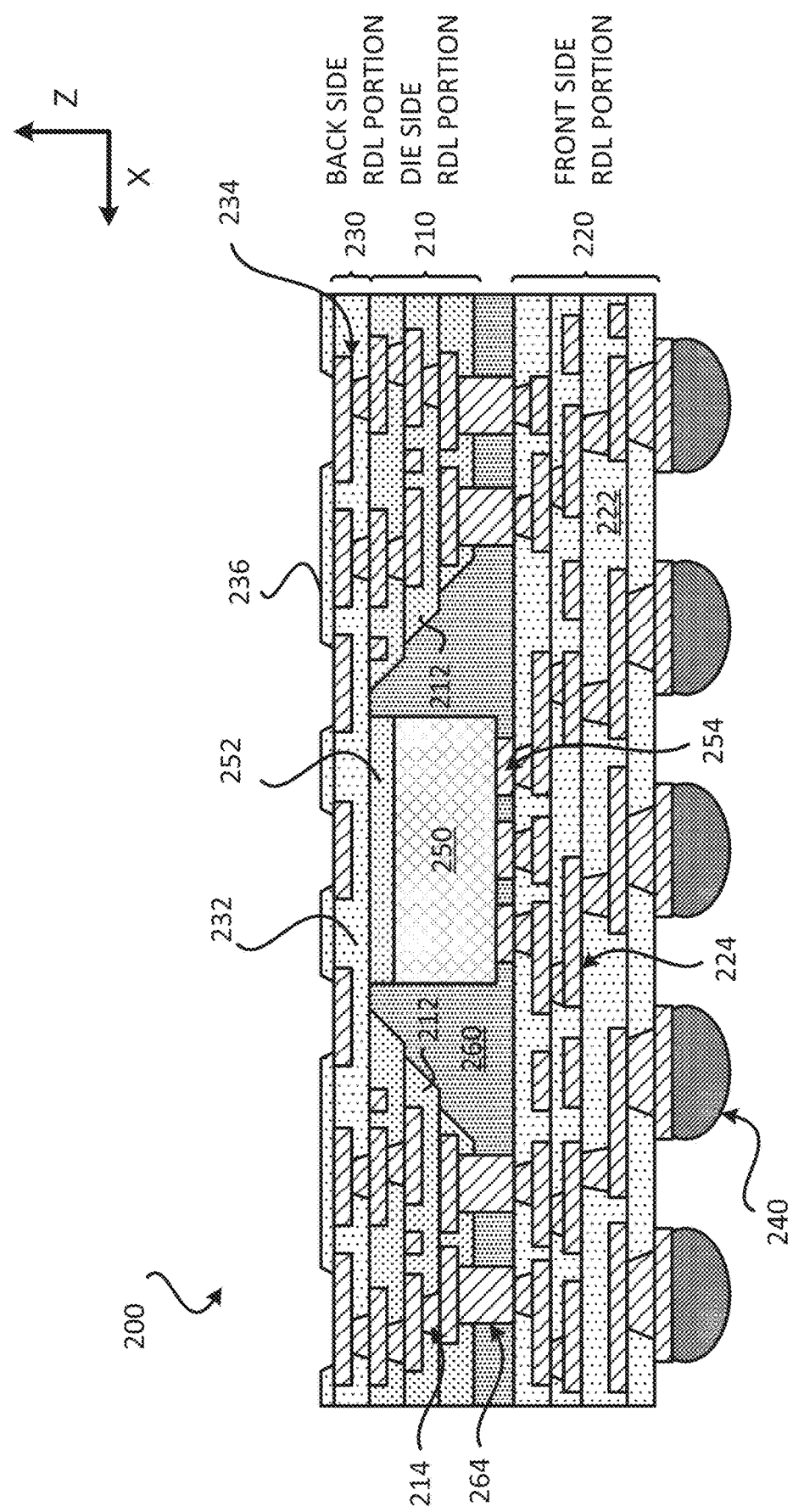
FIG. 2 illustrates a profile view of a package that includes a die and die side redistribution layers.

FIG. 2 illustrates a profile view of a package 200 that includes a die and a die side redistribution layers (RDL). As will be further described below, the die side RDL may help increase the routing interconnect density of the package, while maintaining or reducing the overall height of the package. Moreover, by utilizing the lateral space next to and around the die, the congestion and routing of interconnects may be eased (e.g., in other portions of the package), and this may help reduce the overall size of the package and provide a more reliable package.

The package 200 may be a first package. The package 200 may be an integrated device package. The package 200 includes a first redistribution portion 210, a second redistribution portion 220, and a third redistribution portion 230. The first redistribution portion 210 may be a die side redistribution portion. The second redistribution portion 220 may be a front side redistribution portion. The third redistribution portion 230 may be a back side redistribution portion. The package 200 may also include a plurality of solder interconnects 240, a die 250, and an encapsulation layer 260. The die 250 may be an integrated circuit (IC) die and/or a memory die. The die 250 may include transistors (e.g., CMOS, NMOS transistor, PMOS transistor).

The first redistribution portion 210 (e.g., die side redistribution portion) includes a dielectric layer 212 (e.g., first dielectric layer) and a first plurality of interconnects 214. The first redistribution portion 210 may be a first means for redistribution. The dielectric layer 212 may include one or more dielectric layers. The first plurality of interconnects 214 may include a first plurality of redistribution interconnects. The first redistribution portion 210 may also include a fourth plurality of interconnects 264. The fourth plurality of interconnects 264 may be located in the dielectric layer 212 and the encapsulation layer 260. In some implementations, the fourth plurality of interconnects 264 may travel through the encapsulation layer 260.

The second redistribution portion 220 (e.g., front side redistribution portion) includes a dielectric layer 222 and a second plurality of interconnects 224. The second redistribution portion 220 may be a second means for redistribution. The dielectric layer 222 (e.g., second dielectric layer) may include one or more dielectric layers. The second plurality of interconnects 224 may include a second plurality of redistribution interconnects. The third redistribution portion 230 (e.g., back side redistribution portion) includes a dielectric layer 232 (e.g., third dielectric layer) and a third plurality of interconnects 234. The third redistribution portion 230 may be a third means for redistribution. The dielectric layer 232 may include one or more dielectric layers. The third plurality of interconnects 234 may include a third plurality of redistribution interconnects. The third redistribution portion 230 may include a dielectric layer 236, which may be a passivation layer. As will be further described below, the first plurality of interconnects 214, the second plurality of interconnects 224, and the third plurality of interconnects 234 may be configured to be electrically coupled to one another to provide one or more electrical paths (e.g., for ground, power and/or signals) in the package 200. For example, the first plurality of interconnects 214 of the first redistribution portion 210, the second plurality of interconnects 224 of the second redistribution portion 220, and the third plurality of interconnects 234 of the third redistribution portion 230 may be configured to be electrically coupled to one another to provide one or more electrical paths (e.g., for ground, power and/or signals) in the package 200 (e.g., provide one or more electrical paths for the die 250).

As shown in FIG. 2, the die 250 is located over the second redistribution portion 220. The die 250 is coupled to the second plurality of interconnects 224 through the plurality of interconnects 254 (e.g., copper pillars). The die 250 has a front side and a back side. The front side of the die 250 faces the second redistribution portion 220. The encapsulation layer 260 at least partially surrounds the die 250 and the plurality of interconnects 254. The encapsulation layer 260 is located over the second redistribution portion 220. The encapsulation layer 260 may be a means for encapsulation. Different implementations may use different materials for the encapsulation layer 260. For example, the encapsulation layer 260 may include a mold, a resin and/or an epoxy. The first redistribution portion 210 is located over (i) the encapsulation layer 260 and (ii) the second redistribution portion 220.

The first redistribution portion 210 is located laterally (e.g., along X direction and/or Y direction) to the die 250. The first plurality of interconnects 214 is coupled to the second plurality of interconnects 224 through the fourth plurality of interconnects 264. As mentioned above, the fourth plurality of interconnects 264 may be part of the first redistribution portion 210, and as such, the fourth plurality of interconnects 264 may be considered part of the first plurality of interconnects 214. The fourth plurality of interconnects 264 may include vias, pillars and/or posts.

The first redistribution portion 210 may be a die side redistribution portion that is configured to provide redistribution of interconnects. As such, interconnects (e.g., 214) that are located laterally to the die 250 may travel vertically and/or horizontally, which may allow for more interconnects in the package without increasing the overall thickness or size of the package 200. In some instances, the overall thickness or size of the package 200 may decrease. For example, by doing the redistribution of interconnects in a lateral space next to and around the die 250, it may reduce the need to do any further redistribution of interconnects in the second redistribution portion 220 and/or the third redistribution portion 230. This in turn, may lead to less interconnect layers (e.g., redistribution layers), and therefore an overall thinner package. In some implementations, putting too many interconnects in a region or portion of a package (even if technically feasible) may result with reliability issues for the package. Thus, doing redistribution of interconnects in a lateral space next to and around the die 250, may provide an opportunity to relieve congestion of interconnects in the second redistribution portion 220 and/or the third redistribution portion 230, which may increase the reliability of the package 200. Therefore, the first redistribution portion 210 provides several technical advantages over other packages that do not include the first redistribution portion 210. The number of interconnect layers for the first redistribution portion 210 may vary with different implementations. In some implementations, the overall thickness or height of the first redistribution portion 210 is equal or less than (i) the thickness of the die 250, (ii) the thickness of the die 250 and the thickness of the adhesive 252, (iii) the thickness of the die 250 and the thickness of the fourth plurality of interconnects 254, and/or (iv) the thickness of the die 250, the thickness of the adhesive 252 and the thickness of the fourth plurality of interconnects 254.

The second redistribution portion 220 is coupled to the plurality of solder interconnects 240. More specifically, the plurality of solder interconnects 240 is coupled to the second plurality of interconnects 224. The plurality of solder interconnects 240 may be coupled to a printed circuit board (PCB) (which is not shown). As mentioned above, the second plurality of interconnects 224 is coupled to the die 250 and the first plurality of interconnects 214. The second redistribution portion 220 may be a front side redistribution portion of the package 200.

FIG. 2 illustrates that the second redistribution portion 220 includes 4 metal layers (e.g., interconnect layers). However, different implementations may have a different number of metal layers in the second redistribution portion 220. The number of metal layers may be reduced through the use of the first redistribution portion 210, since redistribution interconnects that may have been located in the second redistribution portion 220 may now be located in the first redistribution portion 210.

The third redistribution portion 230 is located over the first redistribution portion 210, the encapsulation layer 260 and the die 250. The third plurality of interconnects 234 may be coupled to the second plurality of interconnects 214. FIG. 2 illustrates that the third redistribution portion 230 has one metal layer (e.g., interconnect layer). This may be due to the fact that redistribution interconnects that may have been located in the third redistribution portion 230 may now be located in the second redistribution portion 220. The end result is a package 200 that is thinner without sacrificing the routing of the interconnects and/or placement of the opening of the pads for packages. FIG. 2 also illustrates that the die 250 is coupled to the third redistribution portion 230 through an adhesive 252. The adhesive 252 may include silicon, epoxy, and/or combinations thereof.

A redistribution layer (RDL) may be an extra metal layer in a package and/or integrated device that makes the Input/Output (IO) pads of a package and/or integrated device available in other locations of the package and/or integrated device, for better access to the pads where necessary. A redistribution portion may include one or more RDLs. The first redistribution portion 210, the second redistribution portion 220, and the third redistribution portion 230 are portions of the package that may be fabricated using the same or similar fabrication processes (which is further described below). While each redistribution portion may have a different numbers of metal layers (e.g., different number of redistribution layers), each metal layer may have approximately the same thickness. Similarly, because of the use of the same or similar fabrication processes, the minimum line and minimum spacing (L/S) of the interconnects in the first redistribution portion 210, the second redistribution portion 220, and the third redistribution portion 230 may be in a range of about 5-10 micrometers (μm)/5-10 micrometers (μm). In some implementations, each metal layer may have a thickness in a range of approximately 2-10 micrometers (μm). In some implementations, the package 200 may have a thickness in a range of approximately 200-500 micrometers (μm). In some implementations, the first redistribution portion 210 may have a thickness in a range of approximately 50-150 micrometers (μm). In some implementations, the second redistribution portion 220 may have a thickness in a range of approximately 20-50 micrometers (μm). In some implementations, the third redistribution portion 230 may have a thickness in a range of approximately 8-40 micrometers (μm). In some implementations, the die 250 may have a thickness in a range of approximately 60-200 micrometers (μm). Different implementations may use different materials for the dielectric layers. In some implementations, the dielectric layer may be a photo-etchable dielectric layer. The dielectric layer may include PID and/or PSR.

FIG. 2 illustrates one example of an implementation of a package that includes die side redistribution layers. Different implementations may have different configurations and/or arrangements of components. For example, the package 200 may be implemented as part of a package on package (PoP). The package 200 may also be coupled to another die. In some implementations, the package 200 may include more than one die that is encapsulated by the encapsulation layer 260. Other exemplary implementations and configurations of a package are described and illustrated below.

Figure 3:
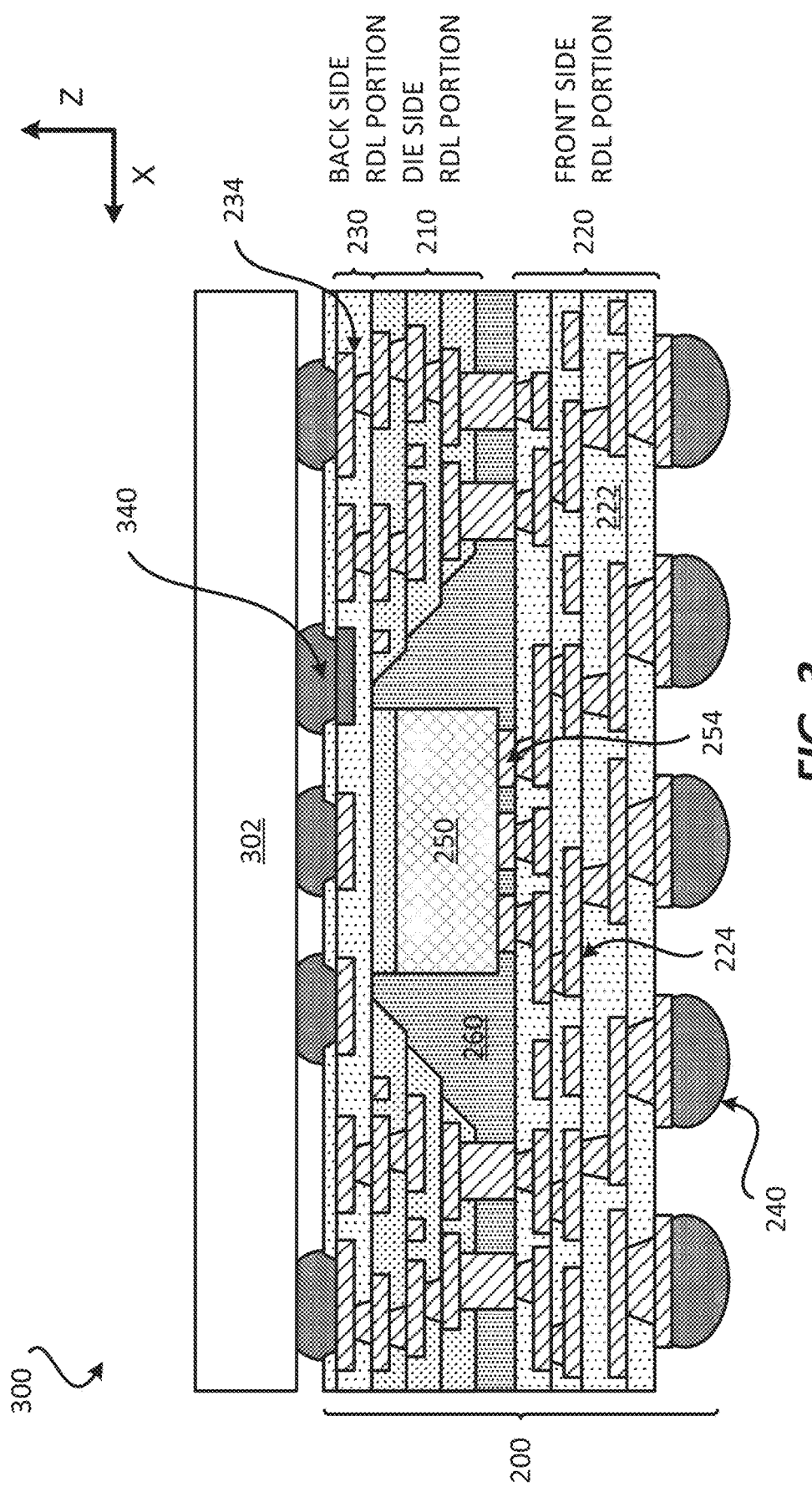
FIG. 3 illustrates a profile view of a package that includes a first package having a die and a die side redistribution layers, and another die over the first package.

FIG. 3 illustrates a package 300 that includes the first package 200 and a second die 302. The package 300 may be an integrated device package 300. The second die 302 is coupled to the first package 200 through a plurality of solder interconnects 340. As shown in FIG. 3, the second die 302 is coupled to a back side of the package 200. In particular, the second die 302 is coupled to the third plurality of interconnects 234 of the third redistribution portion 230 of the package 200.

Figure 4:
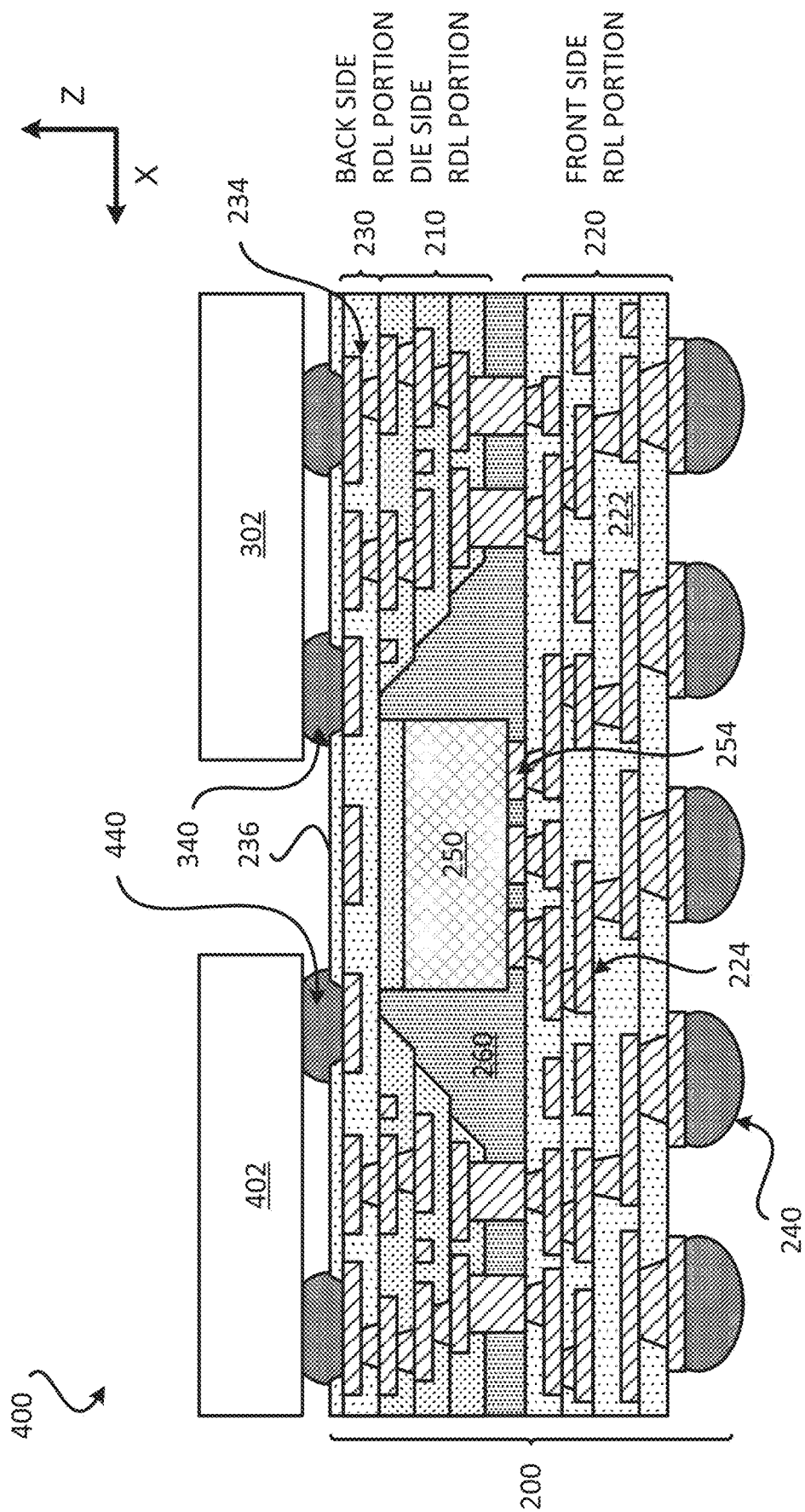
FIG. 4 illustrates a profile view of a package that includes a first package having a die and a die side redistribution layers, and several dies over the first package.

FIG. 4 illustrates a package 400 that includes the first package 200, a second die 302, and a third die 402. The package 400 may be an integrated device package 400. The second die 302 is coupled to the first package 200 through a plurality of solder interconnects 340, and the third die 402 is coupled to the first package 200 through a plurality of solder interconnects 440. As shown in FIG. 4, the second die 302 and the third die 402 are coupled to a back side of the package 200. In particular, the second die 302 and the third die 402 are coupled to the third plurality of interconnects 234 of the third redistribution portion 230 of the package 200.

Figure 5:
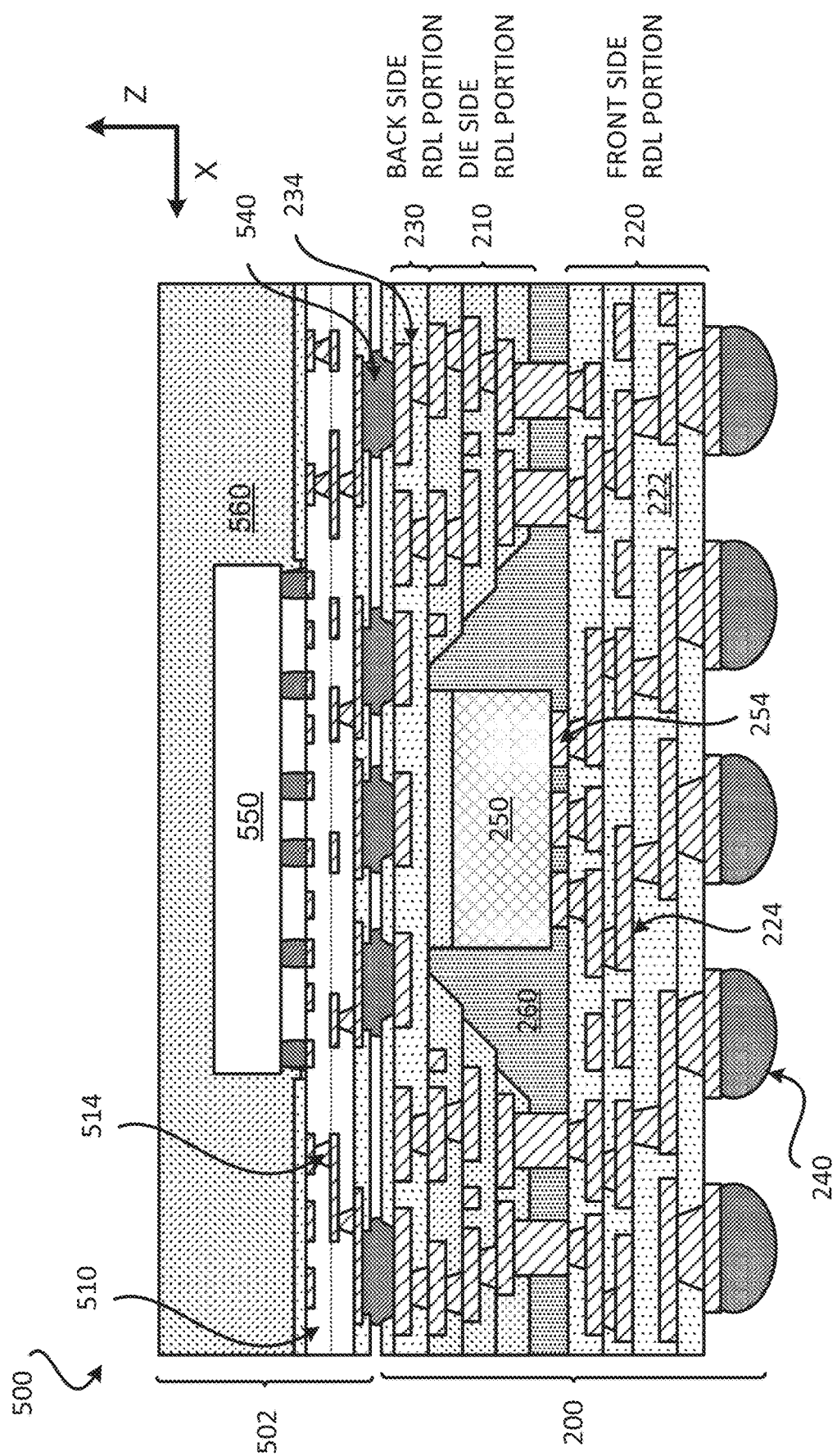
FIG. 5 illustrates a profile view of a package on package (PoP) that includes a first package having a die and a die side redistribution layers, and a second package over the first package.

In some implementations, another package may be coupled to the package 200. FIG. 5 illustrates an example of a package on package (PoP) 500 that includes the first package 200 and a package 502. The package 502 includes a substrate 510, a die 550 and an encapsulation layer 560. The package 502 may be an integrated device package. The package 502 may be a second package (e.g., second integrated device package). The die 550 is coupled to the substrate 510. The substrate 510 may be a laminate substrate. The substrate 510 may include a plurality of interconnects 514. The encapsulation layer 560 is formed over the substrate 510 and encapsulates the die 550. The package 502 is coupled to the first package 200 through a plurality of solder interconnects 540. As shown in FIG. 5, the package 502 is coupled to a back side of the package 200. In particular, the package 502 is coupled to the third plurality of interconnects 234 of the third redistribution portion 230 of the package 200.

FIGS. 2-5 illustrate examples of packages (e.g., integrated device packages) that utilize die side redistribution layers. Different implementations may have different configurations and/or arrangements of the various components of a package.

Having described various different packages with die side redistribution layer(s), a sequence for fabricating a package that includes die side redistribution layers will now be described below.

Exemplary Sequence for Fabricating a Package Having a Die and a Die Side Redistribution Layers (RDL)

FIG. 6 (which includes FIGS. 6A-6I) illustrates an exemplary sequence for providing or fabricating a package that includes die side redistribution layers. In some implementations, the sequence of FIGS. 6A-6I may be used to provide or fabricate the package 300 of FIG. 3, or any of the packages described in the disclosure.

It should be noted that the sequence of FIGS. 6A-6I may combine one or more stages in order to simplify and/or clarify the sequence for providing or fabricating the die. In some implementations, the order of the processes may be changed or modified. In some implementations, one or more of processes may be replaced or substituted without departing from the spirit of the disclosure. In some implementations, fabricating some of the components may include using a semi additive process (SAP) and/or a modified semi additive process (mSAP). However, different implementations may fabricate a package differently.

Figure 6A:
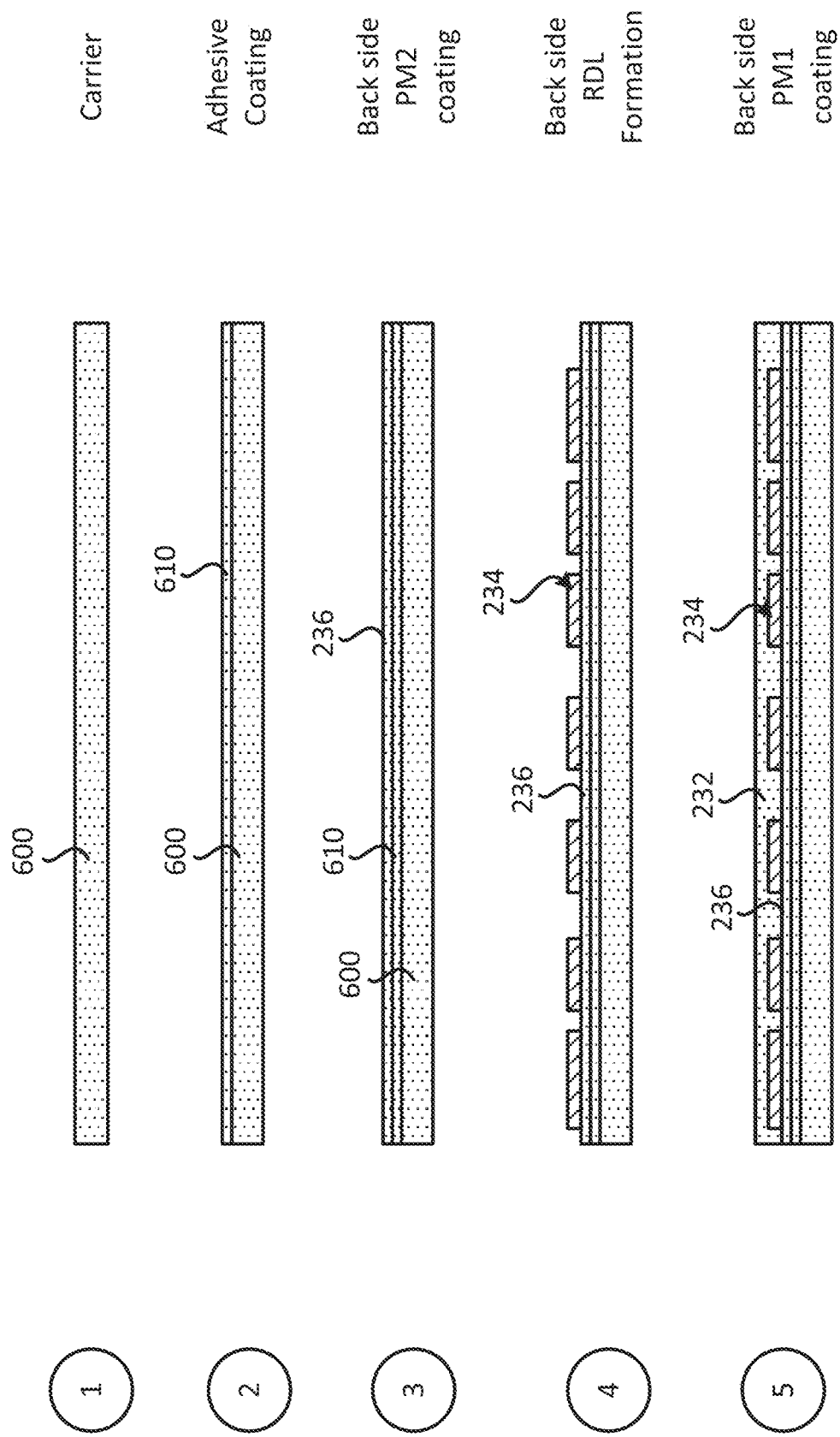
FIG. 6 (comprising FIGS. 6A-6I) illustrates an exemplary sequence for fabricating a package that includes a die and die side redistribution layers.

Stage 1, as shown in FIG. 6A, illustrates a state after a carrier 600 is provided. The carrier 600 may be a substrate and/or a wafer. The carrier 600 may include glass and/or silicon. The carrier 600 may be a first carrier.

Stage 2 illustrates a state after an adhesive layer 610 is disposed (e.g., formed) over the carrier 600. The adhesive layer 610 may be an adhesive film.

Stage 3 illustrates a state a dielectric layer 236 is disposed over the adhesive layer 610. The dielectric layer 236 may include a polymer material. The dielectric layer 236 may be a passivation layer. Different implementations may use different types of passivation layers. The passivation layer may include PSR, SR, PID and/or ABF. The dielectric layer 236 may form part of the back side redistribution portion (e.g., third redistribution portion 230).

Stage 4 illustrates a state after the third plurality of interconnects 234 is formed over the dielectric layer 236. The third plurality of interconnects 234 may include traces and/or pads. Forming the third plurality of interconnects 234 may include forming a seed layer, performing a lithography process, a plating process, a stripping process and/or an etching process. Stage 4 illustrates an example of forming a redistribution layer (e.g., redistribution metal layer) for the third redistribution portion 230.

Stage 5 illustrates a state after the dielectric layer 232 is formed over the third plurality of interconnects 234. The dielectric layer 232 may form part of the third redistribution portion 230. The dielectric layer 232 may include polymer.

Figure 6B:
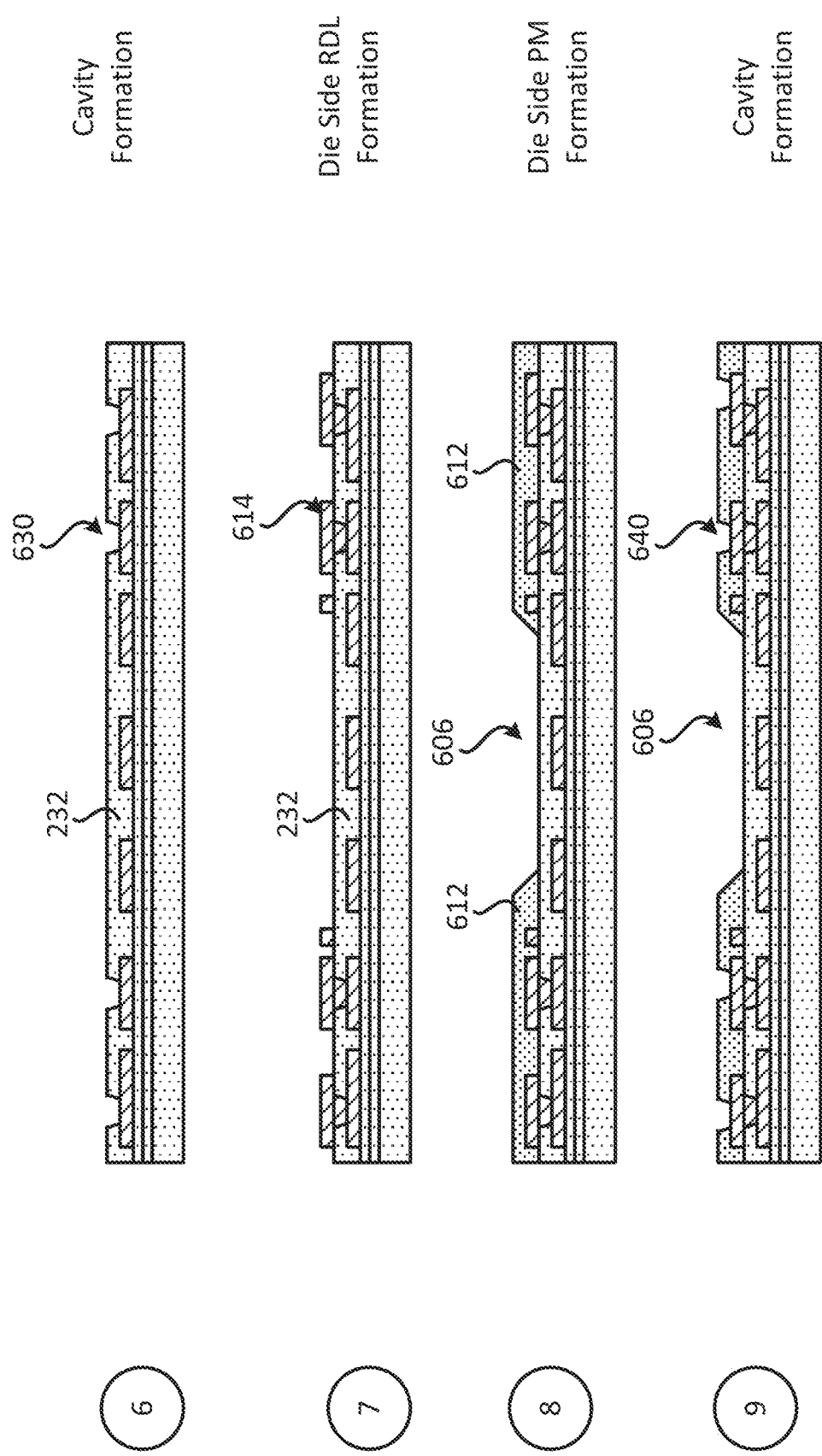

Stage 6, as shown in FIG. 6B, illustrates a state after cavities 630 are formed in the dielectric layer 232. An etching process may be used to form the cavities 630.

Stage 7 illustrates a state after a plurality of interconnects 614 are formed over the dielectric layer 232. The plurality of interconnects 614 may include vias, traces and/or pads. Forming the plurality of interconnects 614 may include forming a seed layer, performing a lithography process, a plating process, a stripping process and/or an etching process. Stage 7 illustrates an example of forming a redistribution layer (e.g., redistribution metal layer) for the first redistribution portion 210. The plurality of interconnects 614 may be part of the first plurality of interconnects 214.

Stage 8 illustrates a state after the dielectric layer 612 is formed over the plurality of interconnects 6144. The dielectric layer 612 may form part of the first redistribution portion 210. The dielectric layer 612 may be part of the dielectric layer 212 as described in FIG. 2. Stage 8 illustrates an opening 606 or cavity in the dielectric layer 612. The opening 606 will be used as space for a die.

Stage 9 illustrates a state after cavities 640 are formed in the dielectric layer 612. An etching process may be used to form the cavities 640.

Figure 6C:
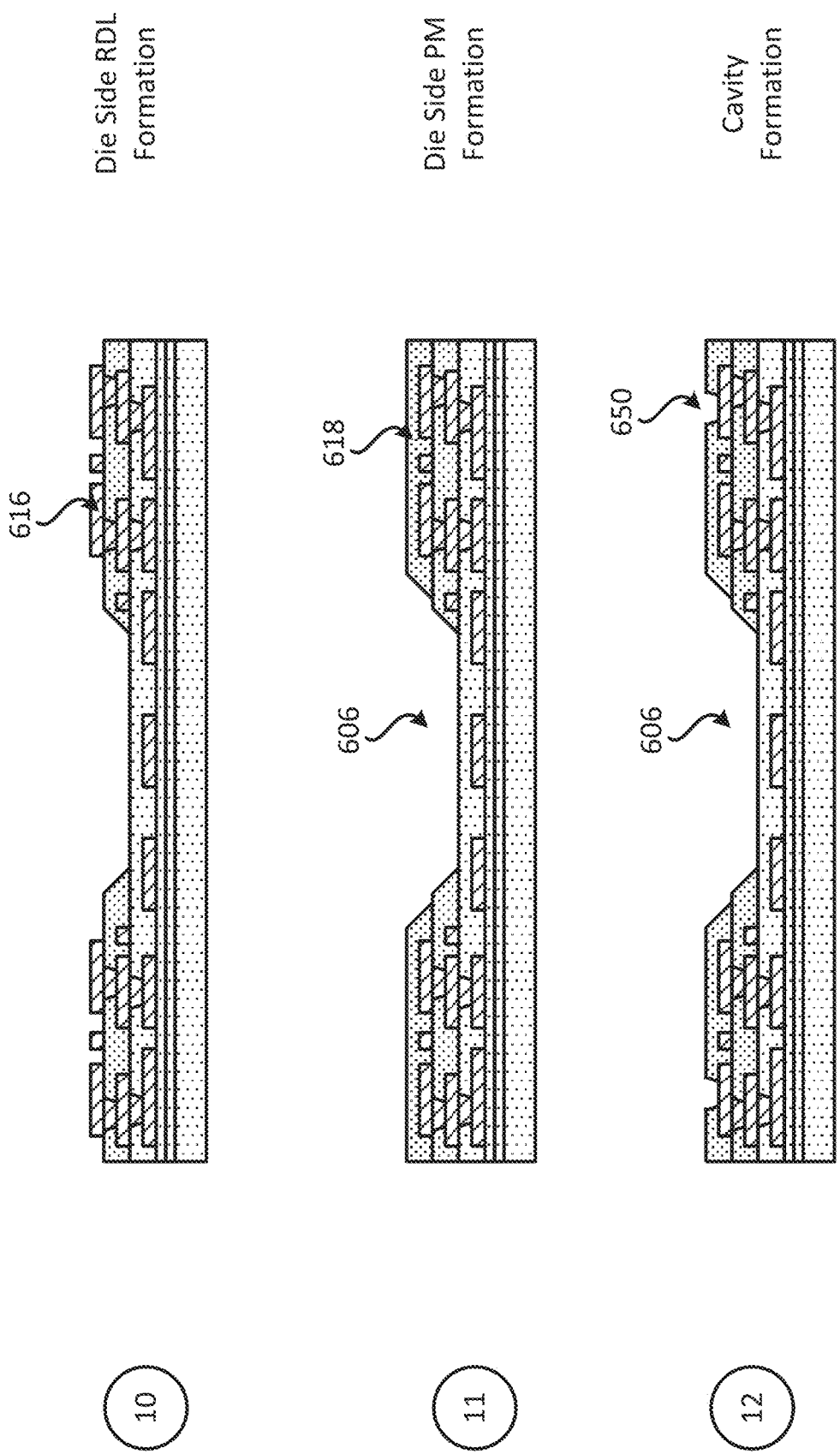

Stage 10, as shown in FIG. 6C, illustrates a state after a plurality of interconnects 616 is formed over the dielectric layer 232. The plurality of interconnects 616 may include vias, traces and/or pads. Forming the plurality of interconnects 616 may include forming a seed layer, performing a lithography process, a plating process, a stripping process and/or an etching process. Stage 10 illustrates an example of forming a redistribution layer (e.g., redistribution metal layer) for the first redistribution portion 210. The plurality of interconnects 616 may be part of the first plurality of interconnects 214.

Stage 11 illustrates a state after the dielectric layer 612 is formed over the plurality of interconnects 614. The dielectric layer 612 may form part of the first redistribution portion 210. The dielectric layer 612 may be part of the dielectric layer 212 as described in FIG. 2.

Stage 12 illustrates a state after cavities 650 are formed in the dielectric layer 618. An etching process may be used to form the cavities 650. Stage 12 illustrates an opening 606 or cavity in the dielectric layer 618. The opening 606 in the dielectric layer 618 is larger than the opening 606 in the dielectric layer 612.

Figure 6D:
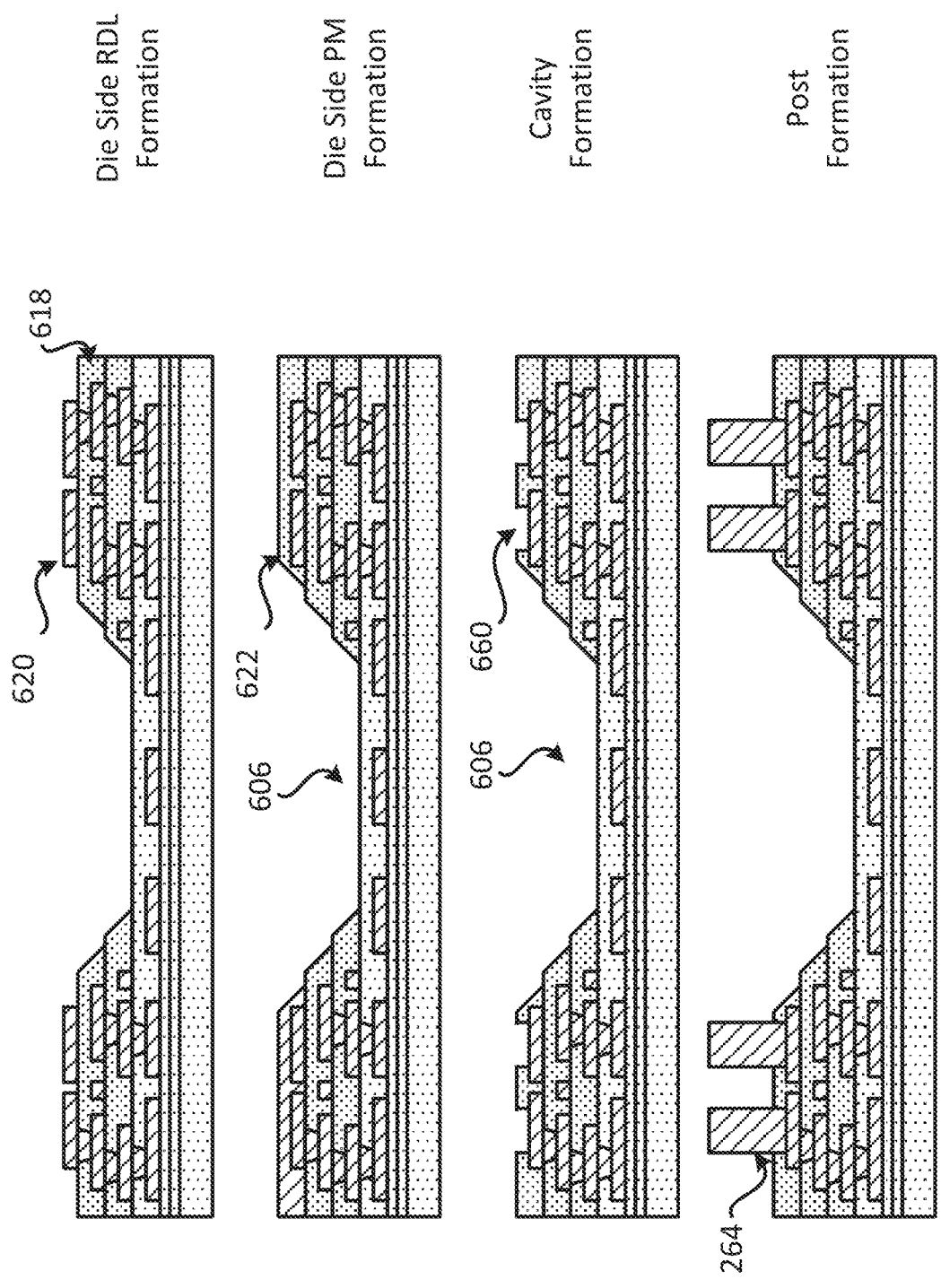

Stage 13, as shown in FIG. 6D, illustrates a state after a plurality of interconnects 620 is formed over the dielectric layer 618. The plurality of interconnects 620 may include vias, traces and/or pads. Forming the plurality of interconnects 620 may include forming a seed layer, performing a lithography process, a plating process, a stripping process and/or an etching process. Stage 13 illustrates an example of forming a redistribution layer (e.g., redistribution metal layer) for the first redistribution portion 210. The plurality of interconnects 620 may be part of the first plurality of interconnects 214.

Stage 14 illustrates a state after the dielectric layer 622 is formed over the plurality of interconnects 620. The dielectric layer 622 may form part of the first redistribution portion 210. The dielectric layer 622 may be part of the dielectric layer 212 as described in FIG. 2.

Stage 15 illustrates a state after cavities 660 are formed in the dielectric layer 622. An etching process may be used to form the cavities 660. Stage 15 illustrates an opening 606 or cavity in the dielectric layer 622. The opening 606 in the dielectric layer 622 is larger than the opening 606 in the dielectric layers 612 and/or 618.

Stage 16 illustrates a state after a fourth plurality of interconnects 264 is formed. Forming the fourth plurality of interconnects 264 may include forming a seed layer, performing a lithography process, a plating process, a stripping process and/or an etching process. The fourth plurality of interconnects 264 may include vias, pillars and/or posts.

Stage 17, as shown in FIG. 6E, illustrates a state after a die 250 is coupled to the third redistribution portion 230. In particular, the back side of the die 250 is coupled to the dielectric layer 232 through an adhesive 252. The front side of the die 250 faces away from the third redistribution portion 230. The adhesive 252 may include a film layer (e.g., die attach film (DAF)). The die 250 includes a plurality of interconnects 254 and a plurality solder interconnects 654. The die 250 may be positioned in the opening 606 of the dielectric layers (e.g., 212, 612, 618, 622) through pick and place process.

Stage 18 illustrates a state after an encapsulation layer 260 is disposed (e.g., formed) over the die 250, the plurality of interconnects 254, the plurality of solder interconnects 654. Different implementations may provide the encapsulation layer 260 differently. For example, the encapsulation layer 260 may be provided over the die 250, the plurality of interconnects 254, the plurality of solder interconnects 654 by using a compression and transfer molding process, a sheet molding process, or a liquid molding process.

Figure 6F:
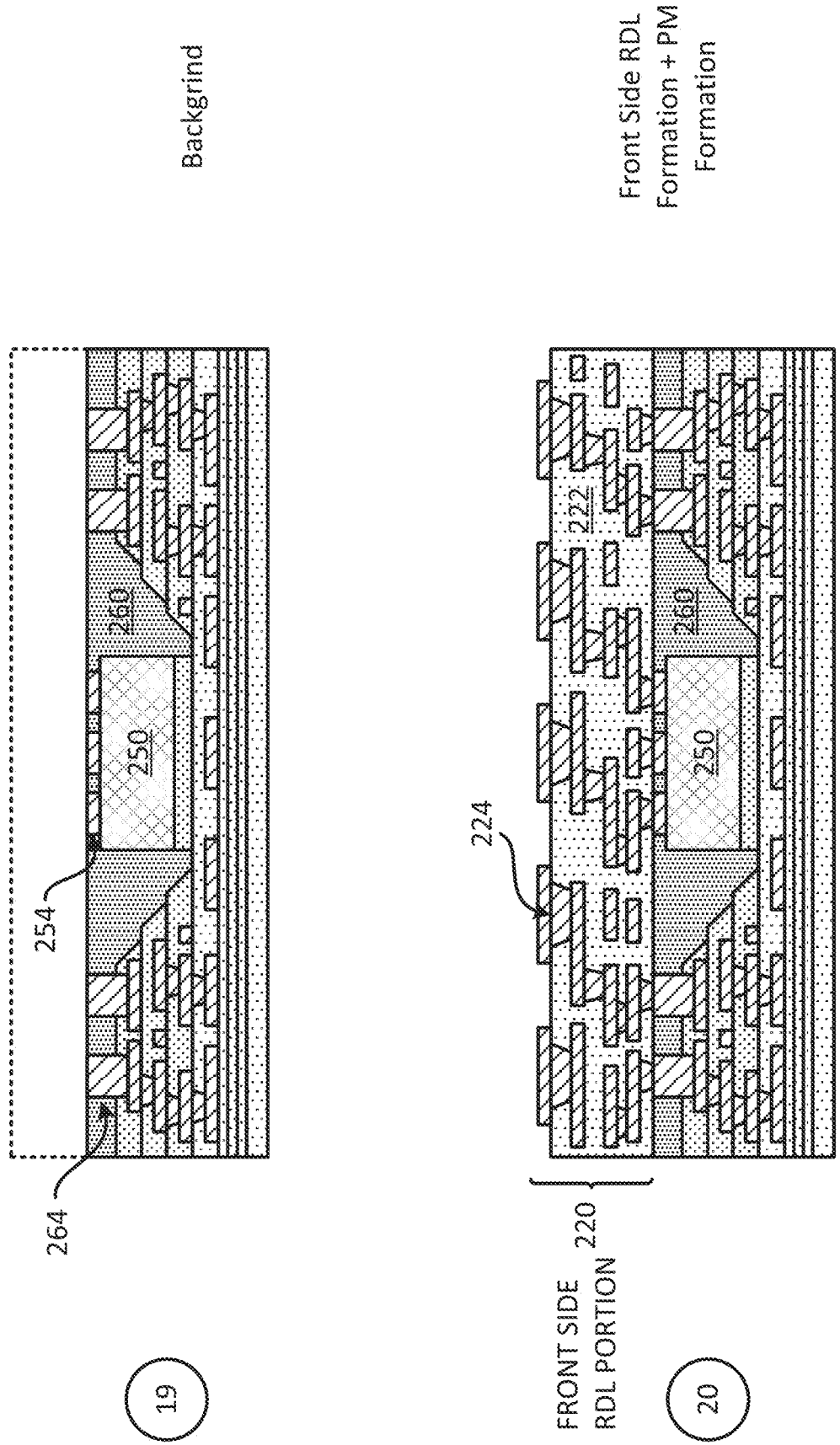

Stage 19, as shown in FIG. 6F, illustrates a state after portions of the encapsulation layer 260 have been removed. A back grind process may be used to remove portions of the encapsulation layer 260. The back grind process may also remove some or all of the fourth plurality of interconnects 264, the plurality of interconnects 254, the plurality of solder interconnects 654.

Stage 20 illustrates a state after the second redistribution portion 220 is formed over the encapsulation layer 260. The process of forming the second redistribution portion 220 includes forming dielectric layer(s) and interconnects, as described above for forming the first redistribution portion 210 (see e.g., Stages 7-15) and the third redistribution portion 230. The second redistribution portion 220 may be a front side redistribution portion of a package.

Figure 6G:
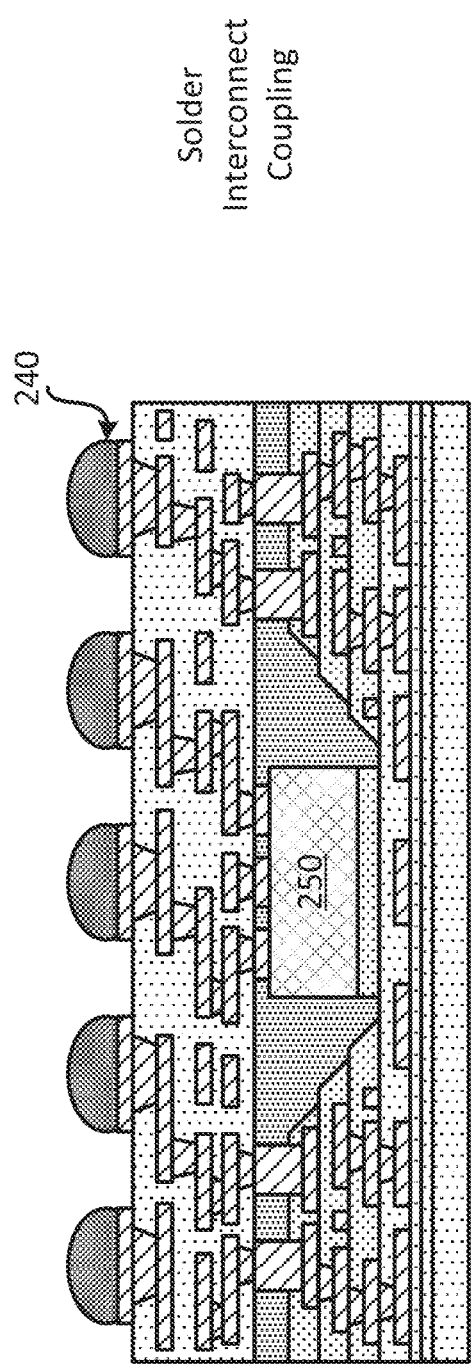
Figure 6G:
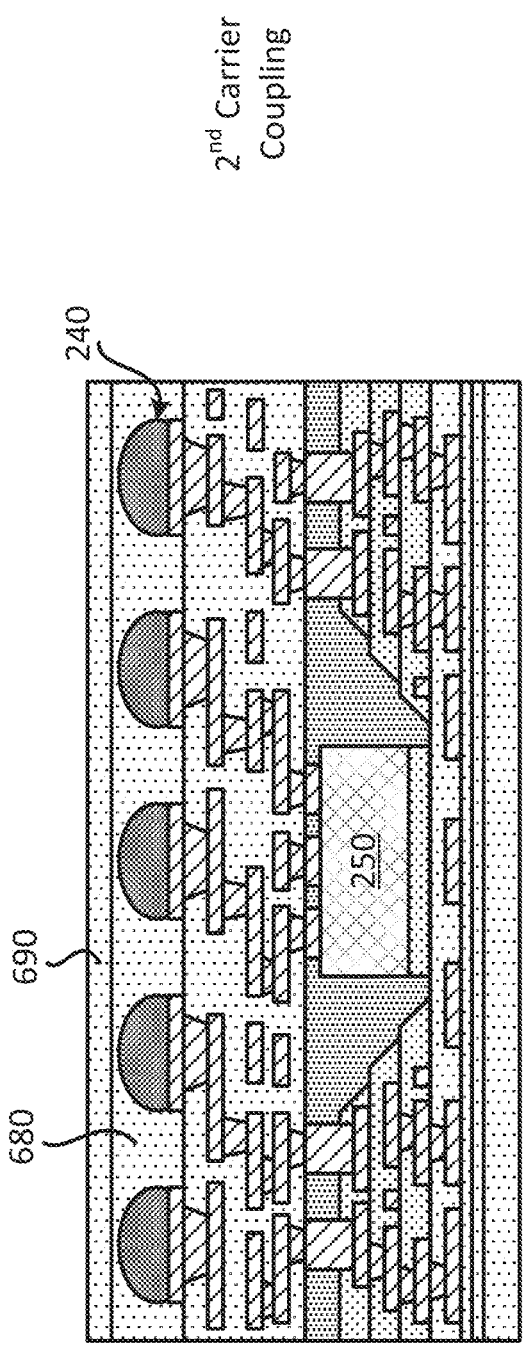

Stage 21, as shown in FIG. 6G, illustrates a state after a plurality of solder interconnects 240 is coupled to the second redistribution portion 220. In particular, the plurality of solder interconnects 240 is coupled to the second plurality of interconnects 224. Coupling the plurality of solder interconnects 240 may include a reflow process.

Stage 22 illustrates a state after a carrier 690 is coupled to the front side of the package. The carrier 690 may be a second carrier. The carrier 690 may include silicon, metal, and/or glass. The carrier 690 is coupled to the front side of the package through a bonding layer 680. The bonding layer 680 may be a temporary bonding film for process handling.

Stage 23, as shown in FIG. 6H, illustrates a state after the carrier 600 and the adhesive layer 610 are detached from the package 200. In addition, Stage 23 illustrates a state after openings are formed in the dielectric layer 236, exposing pads (from the third plurality of interconnects 234).

Stage 24 illustrates a state after a second die (e.g., 302) is coupled to the package 200 through the plurality of solder interconnects 340. A reflow process may be used on the plurality of solder interconnects 340 to couple the second die 302 to the package 200. In some implementations, instead of the second die 302, a package that includes a die may be coupled to the package 200.

Figure 6I:
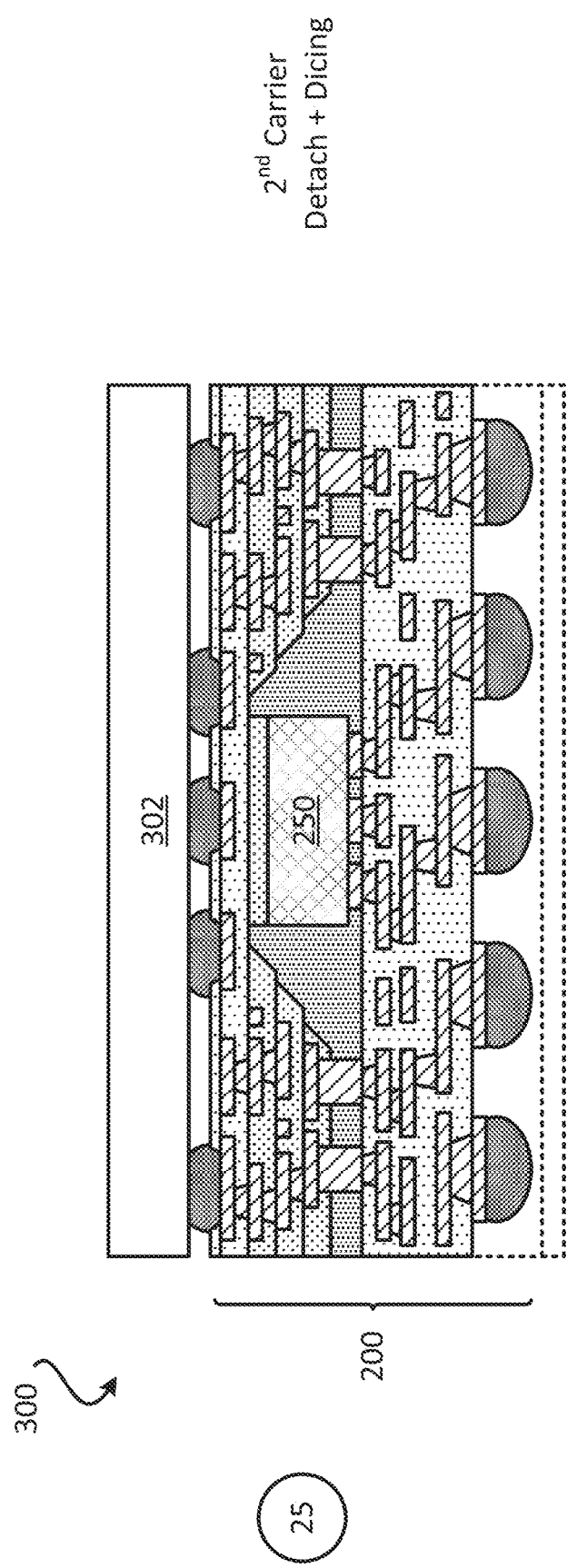

Stage 25, as shown in FIG. 6I, illustrates a state after the carrier 690 has been detached from the package 200, leaving the package 300 that includes the package 200 and the second die 302. In some implementations, the package 300 is part of a wafer, and singulation may be performed to cut the wafer into individual packages.

Exemplary Flow Diagram of a Method for Fabricating a Package Having a Die and Die Side Redistribution Layers (RDL)

Figure 7:
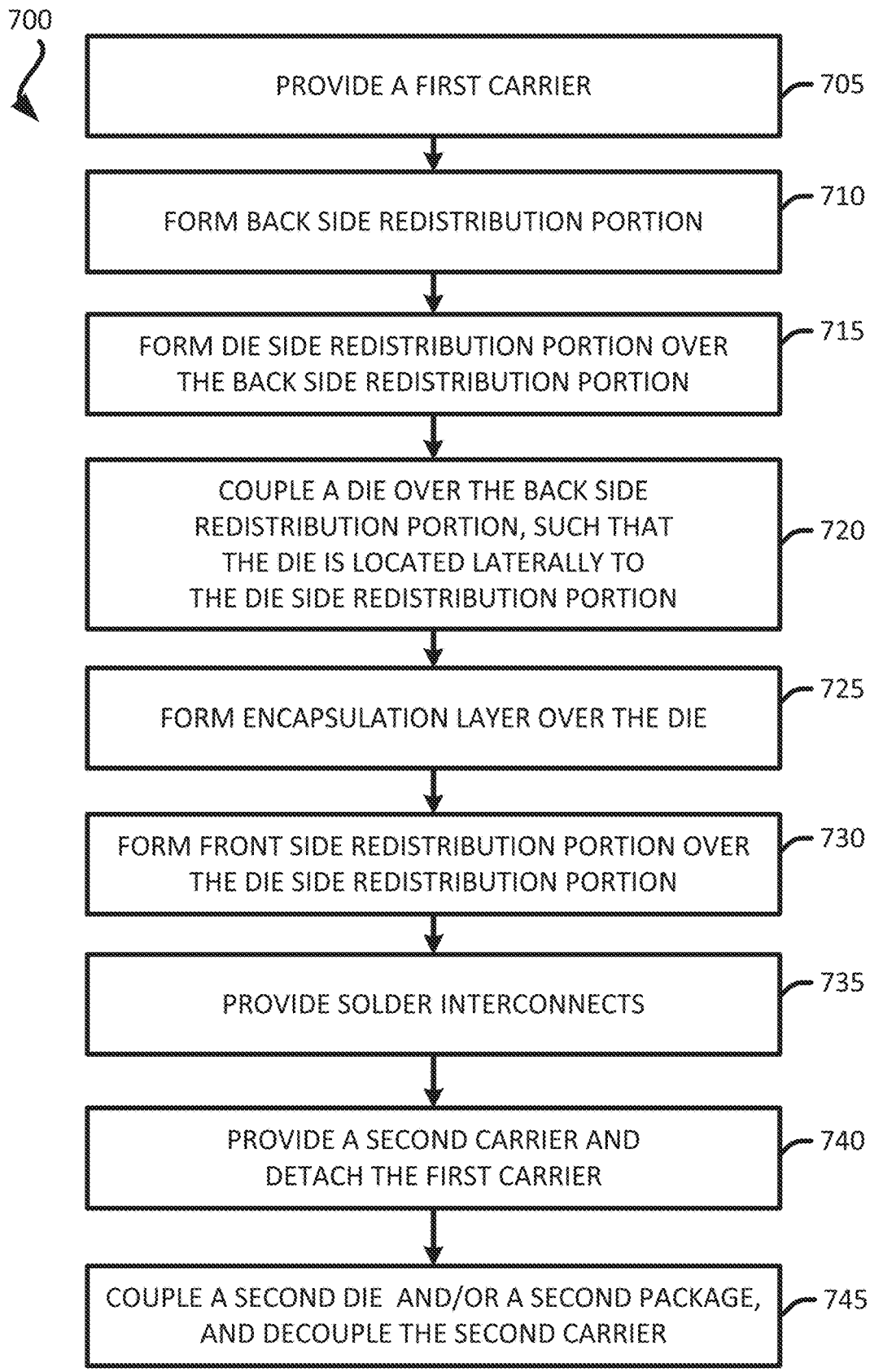
FIG. 7 illustrates an exemplary flow diagram of a method for fabricating a package that includes a die and die side redistribution layers.

In some implementations, fabricating a package that includes a die side redistribution layers that includes several processes. FIG. 7 illustrates an exemplary flow diagram of a method 700 for providing or fabricating package that includes die side redistribution layers. In some implementations, the method 700 of FIG. 7 may be used to provide or fabricate the package of FIG. 3 described in the disclosure. However, the method 700 may be used to provide or fabricate any of the packages described in the disclosure.

It should be noted that the sequence of FIG. 7 may combine one or more processes in order to simplify and/or clarify the method for providing or fabricating a package that includes die side redistribution layers. In some implementations, the order of the processes may be changed or modified.

The method provides (at 705) a first carrier (e.g., 600). The first carrier may be a substrate and/or a wafer. The first carrier may include glass and/or silicon. In some implementations, providing the first carrier may include disposing an adhesive layer (e.g., 610) over the first carrier. Stages 1-2 of FIG. 6A illustrate an example of providing a first carrier and disposing an adhesive layer over the carrier.

The method forms (at 710) a back side redistribution portion. The back side redistribution portion may be the third redistribution portion 230. Forming the back side redistribution portion may include forming a dielectric layer (e.g., 236) and a third plurality of interconnects 234 (e.g., redistribution layers). Forming the third plurality of interconnects 234 may include forming a seed layer, performing a lithography process, a plating process, a stripping process and/or an etching process. Stages 3-5 of FIG. 6A illustrate an example of providing a back side redistribution portion.

The method forms (at 715) a die side redistribution portion. The die side redistribution portion may be the first redistribution portion 210. Forming the die side redistribution portion may include forming one or more dielectric layers (e.g., 212, 612, 618, 622) and a first plurality of interconnects 214. Forming the first plurality of interconnects 214 may include forming a seed layer, performing a lithography process, a plating process, a stripping process and/or an etching process. Forming the first plurality of interconnects 214 may also include forming the fourth plurality of interconnects 264. Stages 6-16 of FIGS. 6B-6D illustrate an example of providing a die side RDL portion.

The method provides (at 720) a die (e.g., 250). The die is coupled to the back side redistribution portion (e.g., third redistribution portion 230) such that the die is located laterally to the die side redistribution portion. Providing the die may include coupling the back side of the die 250 to the dielectric layer 232 through an adhesive 252. The front side of the die 250 faces away from the third redistribution portion 230. The adhesive 252 may include a film layer (e.g., die attach film (DAF)). The die 250 includes a plurality of interconnects 254 and a plurality solder interconnects 654. The die 250 may be positioned in the opening 606 of the dielectric layers (e.g., 212, 612, 618, 622) through pick and place process. Stage 17 of FIG. 6E illustrates an example of providing a die.

The method forms (at 725) an encapsulation layer (e.g., 260) over and around the die 250. Forming the encapsulation layer may include encapsulating the die 250, the plurality of interconnects 254, the plurality of solder interconnects 654. Different implementations may provide the encapsulation layer 260 differently. For example, the encapsulation layer 260 may be provided over the die 250, the plurality of interconnects 254, the plurality of solder interconnects 654 by using a compression and transfer molding process, a sheet molding process, or a liquid molding process. In some implementations, forming the encapsulation layer may including performing a back grind process to remove certain portions of the encapsulation layer 260. In addition to the encapsulation layer 260, the back grind process may remove other components such as some or all of the fourth plurality of interconnects 264, the plurality of interconnects 254, and/or the plurality of solder interconnects 654. Stages 18-19 of FIGS. 6E-6F illustrate an example of forming an encapsulation layer and performing a back grind process.

The method forms (at 730) a front side redistribution portion over the encapsulation layer 260. The front side redistribution portion may be second redistribution portion 220. The process of forming the second redistribution portion 220 includes forming dielectric layer(s) and interconnects, as described above for forming the first redistribution portion 210 (see e.g., Stages 7-15). Forming the front side redistribution portion may include forming one or more dielectric layers (e.g., 222) and a second plurality of interconnects 224. Forming the second plurality of interconnects 224 may include forming a seed layer, performing a lithography process, a plating process, a stripping process and/or an etching process. Stage 20 of FIG. 6F illustrates a state after the front side RDL portion is formed.

The method couples (at 735) a plurality of solder interconnects 240 to the front side RDL portion (e.g., second redistribution portion 220). Stage 21 of FIG. 6G, illustrates an example of coupling the plurality of solder interconnects to the front side redistribution portion.

The method couples (at 740) a second carrier 690 the front side redistribution portion. Stage 22 of FIG. 6G, illustrates a state after a second carrier 690 is coupled to the front side of the package. The second carrier 690 may be coupled to the front side of the package through a bonding layer 680. The method also detaches the first carrier 600 and forms openings in the dielectric layer 236. Stage 23 of FIG. 6H, illustrates a state after the carrier 600 and the adhesive layer 610 are detached from the package 200. In addition, Stage 23 illustrates a state after openings are formed in the dielectric layer 236, exposing pads (from the third plurality of interconnects 234).

The method couples (at 745) a second die 302 to the package 200. Coupling the second die 302 may include using a reflow process on the plurality of solder interconnects 340 to couple the second die 302 to the package 200, which may form the package (e.g., 300, 400, 500). In some implementations, instead of the second die 302, another package (e.g., 502) may be coupled to the package 200. Once the second die (e.g., 302) and/or a package (e.g., 502) has been coupled to the package 200, the second carrier 690 may be detached from the package 200. Stages 24-25 illustrate examples of coupling a die to a package and detaching a second carrier from the package. In some implementations, the package (e.g., 300, 400, 500) is part of a wafer, and singulation may be performed to cut the wafer into individual packages.

Exemplary Electronic Devices

Figure 8:
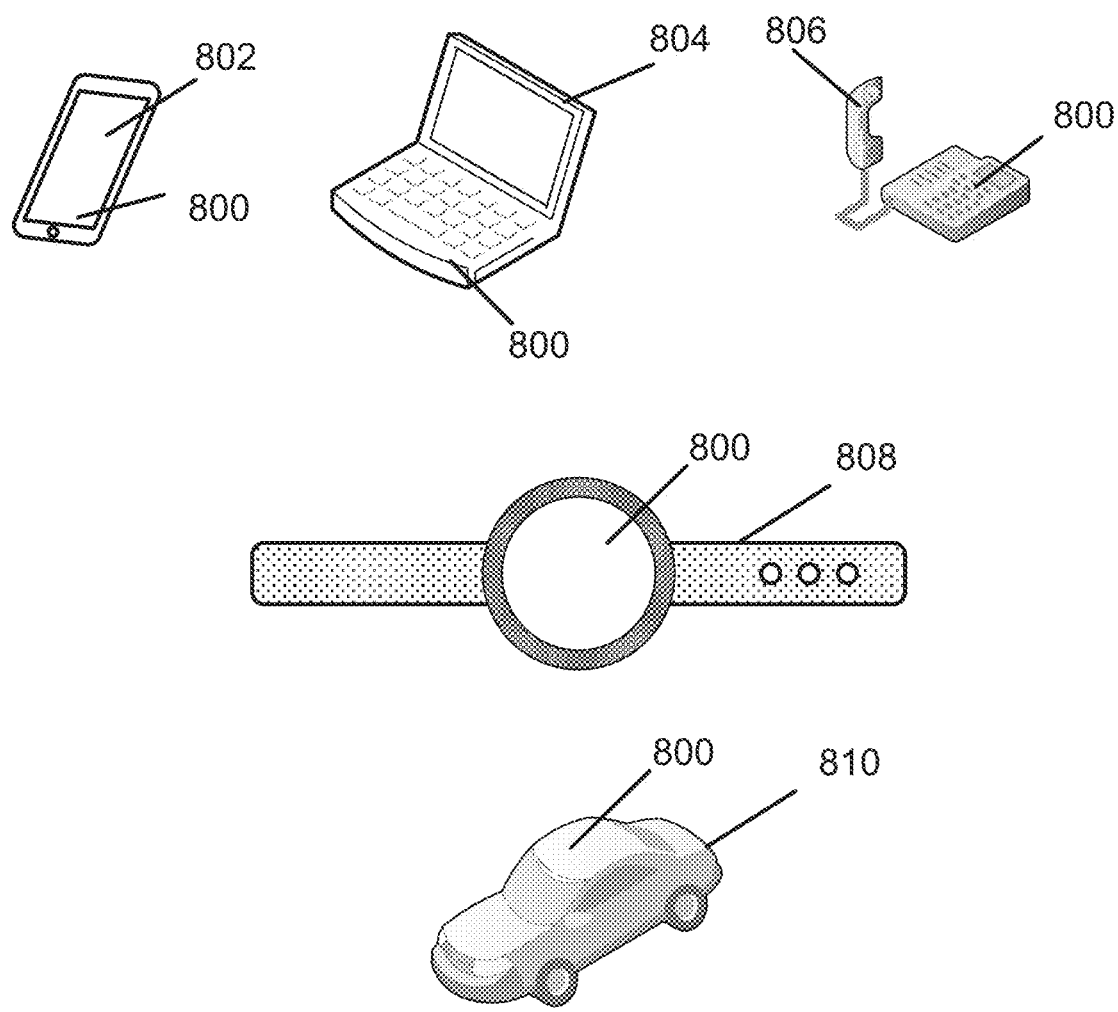
FIG. 8 illustrates various electronic devices that may integrate a die, an integrated device, an integrated passive device (IPD), a passive component, a package, and/or a device package described herein.

FIG. 8 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 802, a laptop computer device 804, a fixed location terminal device 806, a wearable device 808, or automotive vehicle 810 may include a device 800 as described herein. The device 800 may be, for example, any of the devices and/or integrated circuit (IC) packages described herein. The devices 802, 804, 806 and 808 and the vehicle 810 illustrated in FIG. 8 are merely exemplary. Other electronic devices may also feature the device 800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-5, 6A-6I, and/or 7-8 may be rearranged and/or combined into a single component, process, feature or function or embodied in several components, processes, or functions. Additional elements, components, processes, and/or functions may also be added without departing from the disclosure. It should also be noted FIGS. 2-5, 6A-6I, and/or 7-8 and its corresponding description in the present disclosure is not limited to dies and/or ICs. In some implementations, FIGS. 2-5, 6A-6I, and/or 7-8 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "encapsulating" means that the object may partially encapsulate or completely encapsulate another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/ or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a signal (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package comprising:
    a second redistribution portion;
    a die coupled to the second redistribution portion;
    an encapsulation layer encapsulating the die; and
    a first redistribution portion coupled to the second redistribution portion,
        wherein at least a portion of the first redistribution portion and a portion of the die are laterally coplanar with respect to each other,
        wherein the first redistribution portion is located over the second redistribution portion,
        wherein the first redistribution portion includes a plurality of encapsulation interconnects at least partially in the encapsulation layer that directly couples the second redistribution portion to the first redistribution portion, and
    wherein the first redistribution portion and the second redistribution portion are configured to provide one or more electrical paths for the die.

2. The package of claim 1,
    wherein the first redistribution portion comprises:
        at least one first dielectric layer; and
        a first plurality of interconnects,
    wherein the second redistribution portion comprises:
        at least one second dielectric layer; and
        a second plurality of interconnects,
    wherein the first plurality of interconnects and the second plurality of interconnects are configured provide one or more electrical paths for the die.

3. The package of claim 2, further comprising a third redistribution portion comprising:
    at least one third dielectric layer; and
    a third plurality of interconnects,
    wherein the third redistribution portion is located over the second redistribution portion and the encapsulation layer,
    wherein the first plurality of interconnects, the second plurality of interconnects, and third plurality of interconnects are configured provide one or more electrical paths for the die.

4. The package of claim 3,
    wherein the first redistribution portion is a die side redistribution portion,
    wherein the second redistribution portion is a back side redistribution portion, and
    wherein the third redistribution portion is a front side redistribution portion.

5. The package of claim 3, wherein the die is coupled to the third redistribution portion through a die attach film (DAF).

6. The package of claim 3, wherein a minimum line (L) and a minimum spacing (S) of the first plurality of interconnects, the second plurality of interconnects, and the third plurality of interconnects are in a range of 5-10 micrometers (μm)/5-10 micrometers (μm).

7. The package of claim 2, further comprising a fourth plurality of interconnects traveling through the encapsulation layer, wherein the plurality of encapsulation interconnects are coupled to the first plurality of interconnects and the second plurality of interconnects.

8. The package of claim 7, wherein the plurality of encapsulation interconnects includes pillars.

9. The package of claim 1, wherein the encapsulation layer is located between the first redistribution portion and the die.

10. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

11. A package comprising:
    (i) a first integrated device package comprising:
        a second redistribution portion;
        a die coupled to the second redistribution portion;
        an encapsulation layer encapsulating the die; and
        a first redistribution portion coupled to the second redistribution portion,
            wherein at least a portion of the first redistribution portion and a portion of the die are laterally coplanar with respect to each other is located laterally to the die,
            wherein the first redistribution portion is located over the second redistribution portion,
            wherein the first redistribution portion includes a plurality of encapsulation interconnects at least partially in the encapsulation layer that directly couples the second redistribution portion to the first redistribution portion,
        a third redistribution portion located over the first redistribution portion and the encapsulation layer,
            wherein the first redistribution portion, the second redistribution portion, and the third redistribution portion are configured to provide one or more electrical paths for the die, and (ii) an integrated device coupled to the first integrated device package.

12. The package of claim 11, wherein the package is a package on package (PoP).

13. The package of claim 11, wherein the integrated device includes a die.

14. The package of claim 11, wherein the integrated device includes a second integrated device package.

15. The package of claim 11,
wherein the first redistribution portion comprises:
at least one first dielectric layer; and
a first plurality of interconnects,
wherein the second redistribution portion comprises:
at least one second dielectric layer; and
a second plurality of interconnects,
wherein the third redistribution portion comprises:
at least one third dielectric layer; and
a third plurality of interconnects,
wherein the first plurality of interconnects, the second plurality of interconnects, and third plurality of interconnects are configured provide one or more electrical paths for the die.

16. The package of claim 15, wherein a minimum line (L) and a minimum spacing (S) of the first plurality of interconnects, the second plurality of interconnects, and the third plurality of interconnects are in a range of 5-10 micrometers (μm)/5-10 micrometers (μm).

17. The package of claim 15, further comprising a plurality of encapsulation interconnects traveling through the encapsulation layer, wherein the plurality of encapsulation interconnects are coupled to the first plurality of interconnects and the second plurality of interconnects.

18. The package of claim 17, wherein the plurality of encapsulation interconnects includes pillars.

19. The package of claim 11, wherein the encapsulation layer is located between the first redistribution portion and the die.

20. The package of claim 11, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

21. An apparatus comprising:
second means for redistribution;
a die coupled to the second means for redistribution;
means for encapsulation configured to encapsulate the die; and
first means for redistribution coupled to the second means for redistribution,
wherein at least a portion of the first means for redistribution and a portion of the die are laterally coplanar with respect to each other,
wherein the first means for redistribution is located over the second means for redistribution,
wherein the first means for redistribution includes a plurality of encapsulation interconnects at least partially in the means for encapsulation that directly couples the second means for redistribution to the first means for redistribution, and
wherein the first means for redistribution and the second means for redistribution are configured to provide one or more electrical paths for the die.

22. The apparatus of claim 21,
wherein the first means for redistribution comprises:
at least one first dielectric layer; and
a first plurality of interconnects,
wherein the second means for redistribution comprises:
at least one second dielectric layer; and
a second plurality of interconnects,
wherein the first plurality of interconnects and the second plurality of interconnects are configured provide one or more electrical paths for the die.

23. The apparatus of claim 22, wherein a minimum line (L) and a minimum spacing (S) of the first plurality of interconnects and the second plurality of interconnects are in a range of 5-10 micrometers (μm)/5-10 micrometers (μm).

24. The apparatus of claim 22, further comprising a third means for redistribution comprising:
at least one third dielectric layer; and
a third plurality of interconnects,
wherein the third means for redistribution is located over the second means for redistribution and the encapsulation layer,
wherein the first plurality of interconnects, the second plurality of interconnects, and third plurality of interconnects are configured provide one or more electrical paths for the die.

25. The apparatus of claim 24, wherein the die is coupled to the third means for redistribution through a die attach film (DAF).

26. A method for fabricating a package, comprising:
forming a back side redistribution portion;
forming a die side redistribution portion over the back side redistribution portion;
coupling a die to the back side redistribution portion, such that at least a portion of the die and a portion of the die side redistribution are laterally coplanar with respect to each other;
forming an encapsulation layer over the die;
forming a front side redistribution portion over the die side redistribution portion; and
forming a plurality of encapsulation interconnects as part of forming the die side redistribution portion, the plurality of encapsulation interconnects at least partially in the encapsulation layer and directly coupling the die side redistribution portion to the front side redistribution portion.

27. The method of claim 26, wherein the back side redistribution portion and the die side redistribution portion are configured to provide one or more electrical paths for the die.

28. The method of claim 26,
wherein forming the back side redistribution portion comprises:
forming at least one third dielectric layer; and
forming a third plurality of interconnects,
wherein forming the die side redistribution portion comprises:
forming at least one first dielectric layer; and
forming a first plurality of interconnects,
wherein forming the front side redistribution portion comprises:
forming at least one second dielectric layer; and
forming a second plurality of interconnects, and
wherein the first plurality of interconnects, the second plurality of interconnects, and third plurality of interconnects are configured provide one or more electrical paths for the die.

29. The method of claim 26, wherein a minimum line (L) and a minimum spacing (S) of the first plurality of interconnects, the second plurality of interconnects, and the third plurality of interconnects are in a range of 5-10 micrometers (μm)/5-10 micrometers (μm).

30. The method of claim 26, wherein a back side of the die is coupled to the back side redistribution portion through an adhesive.

* * * * *